United States Patent [19]

Lindsay et al.

[11] 4,017,811
[45] Apr. 12, 1977

[54] INVERSE WIEDEMANN EFFECT TORSIONAL DELAY LINE MATCHED FILTER DEVICE

[75] Inventors: George F. Lindsay, Arcadia; Harper John Whitehouse, Hacienda Heights, both of Calif.

[73] Assignee: The United States of America as represented by the Secretary of the Navy, Washington, D.C.

[22] Filed: Feb. 28, 1968

[21] Appl. No.: 710,705

[52] U.S. Cl. ............................................. 333/30 M
[51] Int. Cl.² ......................................... H03H 7/30
[58] Field of Search .......................... 333/30 M, 72; 340/146.2

Primary Examiner—Malcolm F. Hubler
Attorney, Agent, or Firm—Richard S. Sciascia; Ervin F. Johnston

[57] ABSTRACT

A torsional mode, acoustic delay line is disposed over a strip of conducting, non-magnetic material having aligned teeth along its edges. A voltage source is impressed across the ends of the delay line to produce a quiescent concentric magnetic field thereabout. One or more code wires are interlaced through successive pairs of aligned slots between the teeth. The wire is encoded to act as a matched filter sense wire for a binary sequence by selection of the sense of circumferential direction in which the wire passes across the delay line at each pair of slots. The encoding wire is laced across the rear to the tooth-edge strip in order to allow it to be passed through each next successive pair of slots in the desired direction. These lacings on the rear side do not inductively couple with the delay line because of shielding by Eddy current effects produced by presence of a strip of conductor.

5 Claims, 3 Drawing Figures

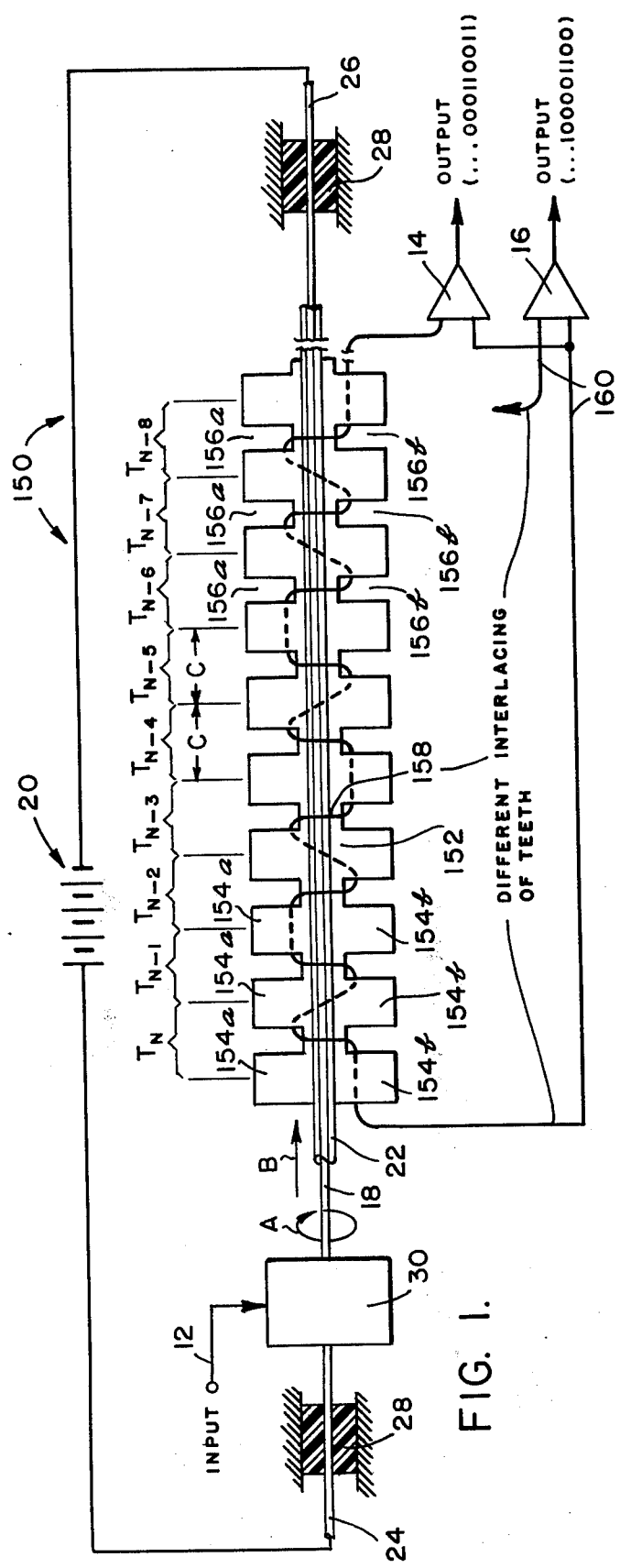
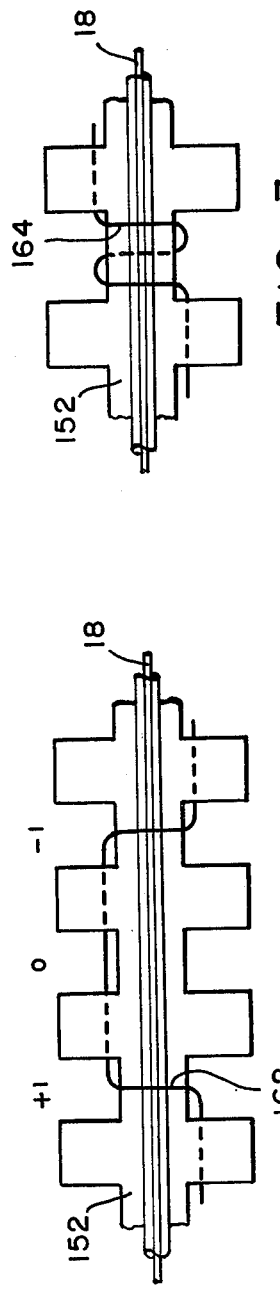

INVERSE WIEDEMANN EFFECT TORSIONAL DELAY LINE MATCHED FILTER DEVICE

BACKGROUND OF THE INVENTION

The invention relates to novel and improved basic construction of a torsional delay line matched filter communication device of the type disclosed in U.S. Pat. No. 3,290,649 to H. J. Whitehouse, entitled "Delay Line Signal Detector."

In the type of device referred to, a torsional stress impulse wave interacts with a plurality of discrete inductive interaction stations disposed in spaced relation along the delay line. These inductive interaction stations selectively produce one or the other of opposite polarity induced voltages for a given sense of delay line impulse, and are arranged in the direction of wave propagation in a sequential order of disposition which is the reverse of the corresponding sequential order of sense of impulse in time of the impulse wave which the device is to detect. Thus, the device has an impulse response which is backward in time to the impulse wave characteristics of the signal it is to detect, which is the criterion for a matched filter. The current importance of matched filter communication devices, and particularly in connection with problems of processing signals in noisy communication channels has been disclosed in the recent publication, "An Introduction to Matched Filters," George L. Turin, IRE Transactions on Information Theory, June 1960, p. 311.

The apparatus described in the above cited U.S. Pat. No. 3,290,649 is satisfactory for many applications. However, certain proposed developments in echo ranging require concurrent searching of the returning signal for a large number of different long binary sequence coded signals, representing the different doppler conditions. With the apparatus of U.S. Pat. No. 3,290,649, this can only be achieved by operation of a number of the apparatuses in parallel, resulting in bulky and complex equipment, and the expense of a large number of components.

One approach in achieving multiple code detection is disclosed in the sequence of the present co-inventors' copending applications consisting of Ser. No. 499,111 entitled "Multiple Code Delay Line Correlator," filed Oct. 20, 1965 and Ser. No. 599,976 entitled "Improved Multiple Code Delay Line Correlator." This approach results in compact apparatus for concurrent searching for a large number of codes. However, it relies on the principle of ferromagnetic inductive coupling. Thus, the coupling at each inductive interaction station is performed by inductive effects in the toroids (Ser. No. 499,111) or by inductive effects through the teeth of a ferromagnetic comb (Ser. No. 599,976). As is well known, the use of ferromagnetic induction effects produces attenuation losses due to ferromagnetic hysteresis. A typical code device has more than 1000 interaction stations and is at least 5 feet long. It has been found that the ferromagnetic hysteresis effects are in such instance cummulative and produce non-uniformity of response among such a large sequence of station. This in turn, restricts the useable bandwidth of the device. As is well known to those skilled in the field of communications engineering, wide bandwidths are very desirable for components of a coherent detection system.

Recognizing the foregoing status of the prior art and seeking to advance same, the objectives of the present invention include:

1. Provision of a novel basic structure of torsional delay line matched filter communication device which is capable of concurrently searching for a large number of different codes.
2. Provision of a device in accordance with the preceding objective which provides higher bandwidth capability than heretofore possible in the prior art.
3. Provision of a device in accordance with the preceding objective which is easy to fabricate.

Other objects and many of the attendant advantages of this invention will be readily appreciated as it becomes better understood by reference to the description and accompanying drawing which follows.

BRIEF DESCRIPTION OF THE DRAWING

FIG. 1 is a diagrammatical illustration of a torsional delay line device embodying the present ivention;

FIG. 2 illustrates a modification of the invention; and

FIG. 3 illustrates another modified form of the invention.

DESCRIPTION OF THE PREFERRED EMBODIMENT

Referring now to the drawing and in particular to FIG. 1, the subject of the invention is an improved torsional delay line matched filter device 150. The parts of device 150 which will first be described have counterparts in he previously cited copending application in Ser. No. 499,111, and have been designated by the same reference characters as are used in that application. Also, it is to be understood that the embodiment shown in FIG. 1 illustrates device 150 with its input and output connections arranged for utilizing same in the detection of particular signal impulse characteristics. The needed rearrangements in order to utilize the device for generating a pulse, will be described later in the text.

An example of the use of device 150 is the detection of the presence of any of a plurality of predetermined serial binary signals in a signal channel, to indicate which signal is present. The signal source is connected to an input lead 12. For purposes of illustrating the invention, it is assumed that the signal source connected to lead 12 is known to contain a continuous serial binary impulse wave signal having a data rate of 2 million bits per second. Preferably, the input signal is of one of the conventional serial binary impulse wave forms in which the signal intelligence is contained in a band pass centered about a frequency corresponding to the data rate. One such form of signal is the so-called "Manchester Code." An output amplifier 14 is the output for indicating presence of a predetermined serial binary sequence signal code having N bits, ending with the binary digit sequence . . . 0, 0, 0, 1, 1, 0, 0, 1, 1. The value of N is in excess of one hundred. A typical operational embodiment for use in correlation detection sonar systems would employ a sequence having a 1024 bits. Another output amplifier 16 is the output for indicating presence of a binary sequence code of N bits ending with the binary digit sequence . . . 1, 0, 0, 0, 0, 1, 1, 0, 0. An operational embodiment would typically include more than two outputs, the total number being limited by the bulkiness of the wiring as will become understood as the specification proceeds.

A torsional acoustic mode delay line wire 18 made of magneto-strictive or magneto-elastic materials has a voltage source 20 coupled across its ends. This produces a continuous quiescent field of concentric circular lines of magnetic flux, illustrated by magnetic line of force A, along the length of the line. A loose fitting insulation sleeve 22 covers wire 18 except for small sections adjacent each end. The ends of the line are designated as an input end 24 and a terminal end 26, each or which are provided with a conventional acoustic absorption termination 28. An electric-acoustic torque wave transducer 30 is operatively connected to the line adjacent its input end 24. One conventional type of transducer operates in cooperation with the concentric flux field produced voltage source 20, by way of employing a winding of wire about the delay line as the means for generating the mechanical stress in the delay line wire. The winding may be a single turn or multi-turn. The interaction of an electrical signal through this coupling winding with the concentric field introduces a torsional stress wave along the delay line by what is commonly referred to as the Wiedemann effect. The input lead 12 of device 150 is connected to the electric terminal side of this transducer. Torsional stress waves launched by transducer 30 propagate along the delay line in the direction of arrow B at a predetermined velocity of propagation. For purposes of illustration it is assumed that delay line 18 has a characteristic acoustic wave propagation velocity $V_c = 0.112$ inches per microsecond.

The parts of device 150 newly disclosed in connection with the present application and therefore without counterparts in the cited copending application, will now be described. A toothed strip element 152 is formed from a strip of conductive, but non-magnetic, metal. A set of uniformly spaced teeth 54a project from one edge of the strip and another set of a like laterally aligned teeth 54b project from the other side. Corresponding slots 156a and 156b are formed between the teeth. Aluminum is a suitable material. The total number of teeth provided on each edge of element 152 is N + 1, where N is the number of binary digits in the previously described binary sequence codes that device 150 serves to detect. Since the binary sequence codes to be detected have an excess of 100 bits, it will be appreciated that the portion of the comb-shaped element 152 illustrated in the drawing is only a small fraction of its total length, as indicated by the break lines in the drawing. Successive teeth are spaced by a distance C equal to the separation between the individual binary impulse components in the continuous serial binary impulse wave signal propagating along delay line 18. The spacing of these impulse components may be conventionally calculated from the data rate of the input signal and the characteristic propagation velocity of the delay line. For example, with the illustrative values previously given, the spacing of the teeth is made at 0.056 inches. Each axial section extending from the center of one tooth to the center of the next tooth constitutes an individual tap station T. The inductive interaction which takes place at these tap stations is described later herein. The tap stations are numerically designated in the sequential order of their appearance in the axial direction along line 18 which is opposite to the direction of propagation of an input signal, i.e. they are designated in the sequential order of their appearance from terminal end 26 to input end 24. Accordingly, the inductive tap interaction tap station nearest input end 24 is designated $T_N$, the next tap station away from the input end 24 is designated $T_{N-1}$, etc.

First and second polarity coding wires 158 and 160 are interlaced through pairs of laterally aligned slots of the successive tap stations $T_{N-7}$, $T_{N-6}$, $T_{N-5}$, ... $T_{N-1}$, in a manner in which a half loop of the wire passes circumferentially over the delay line at each station. For purposes of simplifying the drawing, only the interlacing of wire 158 is shown, it being understood that wire 160 is similarly interlaced in accordance with its particular code. At each tap station wire 160 is selectively passed over the delay line in either of opposite angular directions about the delay line axis as determined by choice of mode of lacing over the back face of the strip element 152. Where the wire is to be passed over the delay line in the same direction at two successive pairs of laterally aligned slots, the wire is laced from the first to the second pair of slots in a helical mode across the back face. Where the wire is to be passed over the delay line in the opposite direction at two successive pairs of slots, the wire is simply laced longitudinally over a tooth on the back side. Using this technique, each wire is interlaced through individual successive pairs of laterally aligned slots of the inductive tap stations to pass over the delay line in one or the other of opposite angular directions in accordance with whether the digits in the corresponding bit positions of the sequence code to be detected are (0) or (1). In the case of wire 158 the clockwise (CW) direction (as viewed looking along the delay line axis from its launcher end) corresponds to a 1 and the counterclockwise (CCW) direction corresponds to a 0. Thus coding wire 158, which is for detection of the sequence ... 0, 0, 0, 1, 1, 0, 0, 1, 1, is interlaced through slots of successive tap stations $T_{N-8}$ ... $T_N$ as follows:

| Inductive Tap Station | Direction of Wire Passing Over Delay Line |
|---|---|
| $T_{N-8}$ | CCW |
| $T_{N-7}$ | CCW |
| $T_{N-6}$ | CCW |
| $T_{N-5}$ | CW |
| $T_{N-4}$ | CW |
| $T_{N-3}$ | CCW |
| $T_{N-2}$ | CCW |
| $T_{N-1}$ | CW |
| $T_N$ | CW |

The lacing over the backside of strip element 152 is shown in the drawing by dashed lines. Note that this is in accordance with the previously described modes of lacing for providing the two possible directions over the front. For example, the wire is laced in a helical mode across the rear face of the strip between the following stations: $T_{N-8}$ to $T_{N-7}$; $T_{N-7}$ to $T_{N-6}$; $T_{N-5}$ to $T_{N-4}$; $T_{N-3}$ to $T_{N-2}$; and $T_{N-1}$ to $T_N$. The wire is laced longitudinally across the adjacent tooth between the following station: $T_{N-6}$ to $T_{N-5}$; $T_{N-4}$ to $T_{N-3}$ and $T_{N-2}$ to $T_{N-1}$. The interlacing of wire 160 (not shown) is done in an analogous manner, but in accordance with its particular code sequence.

The individual selection of direction in which the code wire passes over each tap station effectively codes the inductive interaction station in accordance with the code sequence to be detected. However, it is to be noed that the order of coding of the tap station from the input end 24 of the line to the output end 26 is backward relative to the order of appearance of the bits in the binary sequences. The reason for this will become apparent if it is assumed that a signal of the predetermined bit rate corresponding to tap station spacing C and representing the ... 0, 0, 0, 1, 1, 0, 0, 1, 1, code is launched along delay line 18 through transducer 30. The impulse component representing the first binary number in the sequence will be at the lead end of the traveling wave moving in direction B. Therefore, the impulse component representing the first bit will be nearest to the terminal end 26 of the delay line, and the impulse component representing the Nth number in the sequence will be at the tail end of the traveling wave nearest to input end 24. When the first binary component reaches tap station $T_1$ (not shown in the drawing), the last component will be at station $T_N$. At this moment of time (when the lead end of the traveling wave is at station $T_1$ and the tail end is at station $T_N$) the senses of perturbation of the acoustic impulses of the traveling wave will match the senses of direction of the half loops across the tap stations.

The wires 158 and 160 are wrapped about insulation sleeve 22 with sufficient tightness to serve to bind the sleeve to strip element 152. The segments of the coding wires forming the half loops which pass circumferentially across the delay line are separated therefrom by only thickness of insulation sleeve 22 and the thickness of any underlying wires. This closeness has been found sufficient to establish the desired degree of electromagnetic coupling between the delay line and each such loop even if two or three layers of wire are wrapped through each pair of slots. The inductive phenomenon involved in this electromagnetic coupling is the interaction of the torsional stress wave in the presence of the circular concentric flux produced by voltage source 20. It is the inverse of the previously mentioned Wiedemann effect. The circumferential direction of the half loops provides maximum electromagnetic coupling with this mode of coupling.

In contrast, there is no significant coupling between the segments of the code wires laced over the rear side of strip element 152 and the delay line. This is the result of a combination of their geometry and high frequency Eddy current shielding effects. The segments laced longitudinally across a tooth are disposed in a geometric relationship which provide zero coupling by the inverse Wiedemann mode. The segmemts laced in a helically mode are partially coupled to the delay line, but whatever coupling exists is opposed by high frequency Eddy current shielding due to the strip element 152. The interaction of acoustic signal and the segments of wire laced across the backside of the strip segment will appear as an ultra-high frequency magnetic field which generates Eddy currents in the surface layer of strip element 152. These Eddy currents in turn produce a "counter-magnetic field" which repulses the source field and therefore acts as shielding. The result of this combination of the geometric disposition of the lacings and the shielding effect is that there is no significant coupling between the lacings on the backside of strip 152 and the delay line.

In operation, the individual half loop of the code wire which crosses the delay line at the tap stations each act as an inverse Wiedemann effect inductive pickoff in which is induced a voltage of a sense of polarity and magnitude in accordance with the torsional wave passing across the tap station. Assume then that a signal containing the binary code sequence . . . 0, 0, 0, 1, 1, 0, 0, 1, 1 is applied to input 12. when the acoustic wave impulse components travel across the corresponding tap stations, inductive inpulses will be simultaneously induced into the half loop at the stations. Since the direction in which the individual half loop across the tap stations pass across delay line are matched to the polarity of impulse components, code wire 158 will act as an encoding network to make all the elemental induced voltages additive in the wire. The summation of all the individual inductive effects at the tap stations will be amplified by amplifier 14 indicating detection of the code sequence. similarly, an input containing a . . . 1, 0, 0, 0, 0, 1, 1, 0, 0 serial binary sequence signal would result in the appearance of an output pulse indicating detection of that signal at the output of amplifier 16.

The waveform of the output signal is dependent upon the form of the binary impulse signal wave in the input and typically will not resemble the signal wave of the individual binary bit component of the serial input signal, because of differentiating properties of the transducing actions involved in operation of device 150, and because of band pass limitations of the various components the signal passes through. For a Manchester coded input, the output signal waveform will approximately resemble that shown in FIG. 7, of the previously cited U.S. Pat. No. 3,290,649.

The operation has been described in relation to an idealized code signal being applied to input 12. It will be apparent to those skilled in the conventional principle of correlation detection that the device 152 will also operate to detect a weak signal in noisy channel with signal-to-noise ratios many orders of magnitude poorer than unity.

Although device 150 has been described for use in detection of a signal, it will be appreciated that it also can be employed to generate the code sequence it detects by energizing one of its coding wires and employing a transducer (not shown) at terminal end 26 of the delay line as an output.

FIG. 2 illustrates a modification of invention for synthesizing a matched filter device having three-level digital logic, consisting of the +1, 0, and −1 levels. To encode a station for the +1 level of logic, the coding wire 162 is passed across the delay line in the counter-clockwise direction. To encode a station for the 0 level, the wire is laced over the station on the back side of strip 152. To encode a station for the −1 level, the wire is passed across the delay line in the clockwise direction.

FIG. 3 illustrates a modification of invention in which a scaling of the inductive response at a particular station is provided by wrapping two or more turns of coding wire 164 through the slots at a particular station. It will be appreciated that this modification permits synthesizing device 150's impulse response characteristics for multiple level quantized impulse wave signals, and even permits discrete approximation of analog impulse wave signals.

Obviously many modifications and variations of the present invention are possible in the light of the above teachings. It is therefore to be understood that within the scope of the appended claims the invention may be practiced otherwise than as specifically described.

The invention described herein may be manufactured and used by or for the Government of the United States of America for governmental purposes without the payment of any royalties thereon or therefor.

What is claim is:

1. In a torsional delay line signal processing device of the type having a matched filter response characteristic corresponding to a first predetermined sequence of N binary digits, where N is a numerical value in excess of 100, the combination comprising;
   a. an elongated tooth-edged strip element of non-magnetic, conductive metal, said element having laterally aligned, uniformly spaced, teeth formed along each edge thereof, said element having N + 1 pairs of laterally aligned teeth along its length forming a linear sequence of N pairs of laterally aligned slots between the teeth,
   b. a torsional mode acoustic delay line of magnetoelastic metal disposed over one face of the strip element in the longitudinal direction thereof over the median portion thereof between the teeth,
   c. means operatively associated with said delay line for producing a field of circular magnetic lines of force about the length of the delay line,
   d. a first code wire which is interlaced through individual successive pairs of laterally aligned slots to pass circumferentially over the delay line at each pair of aligned slots in one or the other of opposite angular directions about the delay line axis in accordance with whether the digit in the corresponding bit position of said first sequence of N binary bits is a 0 or a 1, where the wire is to pass over the delay line at the next slot in the same angular direction said wire being interlaced from one to the next of the successive laterally aligned slots by being helically passed around the median portion of the other face of the tooth-edged strip element, where the wire is to be passed over the delay line at the next slot in the opposite angular direction said wire being passed over a tooth at the other face of the tooth-edged strip in a direction parallel to the strip element.

2. Apparatus as defined in claim 1 and further of a type having another independent matched filter response characteristic corresponding to a second predetermined sequence of N binary digits, said apparatus further comprising,
   e. a second code wire interlaced through individual successive pairs of laterally aligned slots in one or the other of opposite angular directions about the delay line axis in accordance with whether the digit in the corresponding bit position of said second sequence of N binary digits is a 0 or 1.

3. Apparatus in accordance with claim 1, and
   f. a signal input comprising an electrical-acoustic wave transducer disposed to one end of said delay line,
   g. said first code wire being interlaced in the linear direction toward the transducer such that the sequential arrangement of angular directions in which the wire passes over the delay line is backward in order relative to the sequential arrangement of the corresponding binary digits in the binary sequence.

4. Apparatus in accordance with claim 1, and
   h. said delay line being encased in a loosely fitting insulator sleeve,
   i. said first code wire serving to bind the insulator sleeve to the strip element.

5. Apparatus in accordance with claim 1,
   j. said means for producing a field of magnetic lines of force comprising a voltage source coupled to the ends of the delay line.

* * * * *